US 7,501,852 B2

(12) United States Patent
Suzuki et al.

(10) Patent No.: US 7,501,852 B2
(45) Date of Patent: Mar. 10, 2009

(54) TOLERANT INPUT CIRCUIT

(75) Inventors: Toyoki Suzuki, Kasugai (JP); Mitsuaki Tomida, Kasugai (JP); Masahiro Iwamoto, Kasugai (JP); Osamu Uno, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/235,226

(22) Filed: Sep. 27, 2005

(65) Prior Publication Data

US 2006/0220686 A1 Oct. 5, 2006

(30) Foreign Application Priority Data

Mar. 29, 2005 (JP) ............................. 2005-096165

(51) Int. Cl.
*H03K 17/16* (2006.01)
*H03K 19/003* (2006.01)

(52) U.S. Cl. ......................... 326/33; 326/113; 327/535; 361/56

(58) Field of Classification Search .................. 326/33, 326/68, 80–83, 86, 113–114; 327/108–109, 327/333, 534–535; 361/56
See application file for complete search history.

(56) References Cited

U.S. PATENT DOCUMENTS

| 5,442,307 | A | | 8/1995 | Shigehara et al. |
| 5,473,500 | A | | 12/1995 | Payne et al. |
| 5,689,209 | A | * | 11/1997 | Williams et al. ............. 327/425 |
| 5,767,733 | A | * | 6/1998 | Grugett ...................... 327/534 |
| 5,811,857 | A | * | 9/1998 | Assaderaghi et al. ........ 257/355 |
| 5,880,605 | A | | 3/1999 | McManus |
| 5,880,620 | A | * | 3/1999 | Gitlin et al. ................. 327/534 |
| 5,973,530 | A | | 10/1999 | Morris et al. |
| 6,404,269 | B1 | * | 6/2002 | Voldman ..................... 327/534 |
| 6,611,026 | B2 | * | 8/2003 | Chang et al. ................ 257/355 |
| 6,628,159 | B2 | * | 9/2003 | Voldman ..................... 327/534 |
| 6,847,511 | B2 | * | 1/2005 | Ohnakado et al. ............. 361/56 |
| 6,965,263 | B2 | * | 11/2005 | Bringivijayaraghavan ... 327/537 |
| 2001/0043112 | A1 | * | 11/2001 | Voldman ..................... 327/534 |
| 2004/0232946 | A1 | | 11/2004 | Koo |
| 2005/0063112 | A1 | | 3/2005 | Negishi et al. |

FOREIGN PATENT DOCUMENTS

CN 1169799 A 1/1998

(Continued)

*Primary Examiner*—Rexford Barnie
*Assistant Examiner*—Jason Crawford
(74) *Attorney, Agent, or Firm*—Arent Fox LLP.

(57) ABSTRACT

A tolerant input circuit that functions stably regardless of fabrication differences without having to adjust the threshold value of an input circuit. The tolerant input circuit includes a step-down device configured by an N-channel MOS transistor connected between an input pad and the input circuit. Voltage from a power supply is supplied to the gate of the N-channel MOS transistor in the step-down device to decrease the voltage of a high voltage signal provided to the input pad to the voltage of the power supply or lower. The signal with decreased voltage is provided to the input circuit. The tolerant input circuit includes a back gate voltage control circuit for increasing back gate voltage of the N-channel MOS transistor in the step-down device when the input pad is provided with a high voltage signal.

13 Claims, 4 Drawing Sheets

FOREIGN PATENT DOCUMENTS

| | | |
|---|---|---|
| JP | 6-204848 A | 7/1994 |
| JP | 6-303126 A | 10/1994 |
| JP | 6-326593 A | 11/1994 |
| JP | 8-008707 A | 1/1996 |
| JP | 10-135818 A | 5/1998 |
| JP | 2000-228622 | 8/2000 |
| JP | 2002-280892 A | 9/2002 |
| JP | 2004-104608 A | 4/2004 |
| JP | 2004-304475 | 10/2004 |

* cited by examiner

TOLERANT INPUT CIRCUIT

CROSS-REFERENCE TO RELATED APPLICATIONS

This application is based upon and claims the benefit of priority from the prior Japanese Patent Application No. 2005-096165, filed on Mar. 29, 2005, the entire contents of which are incorporated herein by reference.

BACKGROUND OF THE INVENTION

The present invention relates to a tolerant input circuit including an input terminal provided with a voltage signal having voltage that is higher than the voltage from a power supply.

There may be cases when a voltage signal having voltage that is higher than the voltage from a power supply is applied to a semiconductor integrated circuit. To ensure that the semiconductor integrated circuit functions normally in such a case, the semiconductor integrated circuit incorporates a tolerant input circuit. The tolerant input circuit includes a step-down device connected between an input pad and an input terminal of an input buffer circuit. The step-down device prevents the input buffer circuit from being damaged by voltage signals provided to the input pad.

FIG. 1 is a schematic circuit diagram showing an example of a tolerant input circuit 100 in the prior art. An input pad 1 is connected to an input terminal of an input buffer circuit 2 via an N-channel MOS transistor Tr1. The gate of the transistor Tr1 is supplied with voltage from a power supply VDD, and the transistor Tr1 is kept constantly activated.

The input terminal of the input buffer circuit 2 is connected to the power supply VDD via an N-channel MOS transistor Tr2. The gate of the transistor Tr2 is connected to the input terminal of the input buffer circuit 2.

In the tolerant input circuit 100, when the input pad 1 is provided with a high level input signal having voltage that is higher than that of the power supply VDD, the transistor Tr1 functions to set an input voltage Va of the input buffer circuit 2 to VDD−Vth1 (Vth1 represents the threshold value of the transistor Tr1). Accordingly, the transistor Tr1 functions as a step-down device and restricts the input voltage Va to VDD−Vth or less.

The tolerant input circuit 100 decreases the input voltage Va of the input buffer circuit 2 to voltage that is less than the breakdown voltage of the input buffer circuit 2 even if the input voltage of the input pad 1 becomes higher than that of the power supply VDD.

Further, when the transistor Tr1 is kept activated, the input voltage Va may become higher than the voltage of the power supply VDD. However, if the input voltage Va becomes higher than the voltage of the power supply VDD for an amount corresponding to the threshold value Vth2 of the transistor Tr2 or greater, the transistor Tr2 functions as a diode. This restricts the input voltage Va to VDD−Vth2 or less.

In such a tolerant input circuit 100, differences resulting from fabrication process or differences in the ambient temperature may result in differences in the threshold value of the transistor Tr1. Due to the recent trend for lower power supply voltages, for example, when the power supply VDD is set to 2.5 V and the high level signal provided to the input pad 1 is set to 3 V, the input voltage Va of the input buffer circuit 2 may be decreased more than necessary because of the difference in the threshold value of the transistor Tr1.

In such a case, referring to FIG. 2, the voltage of an input signal Vah1 of the input buffer 2 becomes lower than the voltage threshold value Vx of the input buffer circuit 2. Thus, the input signal would not be recognized as having a high level and cause an anomaly.

Japanese Laid-Open Patent Publication No. 2004-304475 describes an inverter circuit that functions in accordance with the output voltage of a step-down device to drive a pull-up transistor and ensure the input voltage of a Schmitt inverter, which serves as an input buffer circuit.

Japanese Laid-Open Patent Publication No. 2000-228622 describes controlling the back gate voltage of one of the transistors of a CMOS inverter circuit to vary the threshold value of the transistor and adjust the duty of an output signal.

SUMMARY OF THE INVENTION

In the input circuit of FIG. 1, to prevent anomalous operation of the input buffer circuit 2 when the input voltage Va decreases more than necessary, the threshold value of the input buffer circuit 2 may be lowered. However, when lowering the threshold value of the input buffer circuit 2, the rising speed or falling speed of the output signal of the input buffer circuit with respect to changes in the input voltage Va would becomes biased. More specifically, when the input voltage Va corresponding to the high level input signal is only slightly higher than the threshold value of the input buffer circuit, the rising speed of the output signal of the input buffer circuit 2 would be slower than the falling speed. This would produce a difference between the rising and falling propagation delay times of the input signal and a difference between the duties of the input and output signals. Further, when the input buffer circuit 2 is a Schmitt circuit, the lowering of the threshold value for the high level would reduce the hysteresis. This may result in an anomalous operation.

In the tolerant input circuit described in Japanese Laid-Open Patent Publication No. 2004-304475, fabrication differences in the inverter circuit and pull-up transistor may result in pull-up operation delay of the input voltage of the Schmitt inverter circuit. However, such a delay cannot be avoided. Further, the incorporation of the inverter circuit and the pull-up transistor enlarges the circuit scale.

Japanese Laid-Open Patent Publication No. 2000-228622 does not teach the art of compensating for a decrease in the input voltage of an inverter circuit that occurs due to fabrication differences without having to adjust the threshold value of an inverter circuit.

The present invention provides a tolerant input circuit that functions stably regardless of fabrication differences and without having to adjust the threshold value of the input circuit.

One aspect of the present invention is a tolerant input circuit for connection to a power supply and an input pad. The tolerant input circuit includes an input circuit. A step-down device including a first N-channel MOS transistor is connected between the input pad and the input circuit. The first N-channel MOS transistor of the step-down device having a gate supplied with voltage from the power supply. Voltage of a high voltage signal provided to the input pad is decreased to a value lower than or equal to that of the voltage of the power supply by the step-down device and provided to the input circuit. The first N-channel MOS transistor includes a back gate. A back gate voltage control circuit, connected to the back gate of the first N-channel MOS transistor in the step-down device, increases back gate voltage of the step-down device when the input pad is provided with the high voltage signal.

Another aspect of the present invention is a tolerant input circuit for connection to a power supply and an input pad. The tolerant input circuit includes an input circuit. A first N-channel MOS transistor is connected between the input pad and the input circuit. The first N-channel MOS transistor has a gate connected to the power supply. A second N-channel MOS transistor is connected between the input pad and the back gate of the first N-channel MOS transistor.

A further aspect of the present invention is a tolerant input circuit for connection to a power supply and an input pad. The tolerant input circuit includes an input circuit. A first N-channel MOS transistor is connected between the input pad and the input circuit. The first N-channel MOS transistor has a gate connected to the power supply and a back gate connected to a node between the first N-channel MOS transistor and the input circuit.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
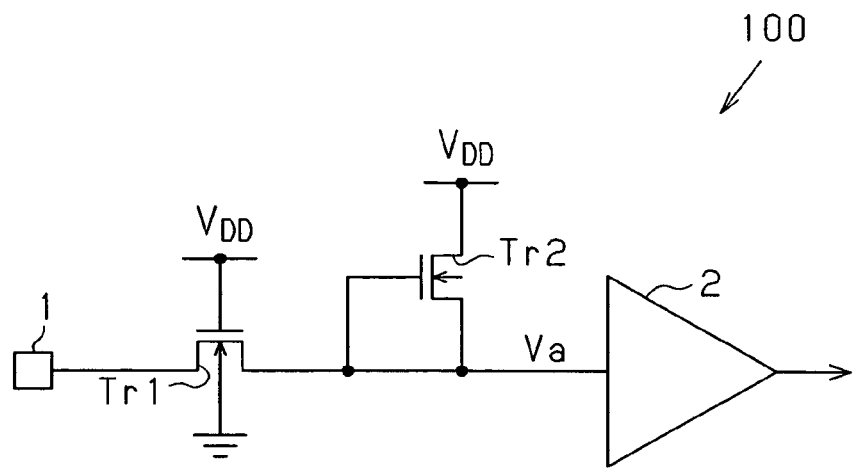
FIG. 1 is a schematic circuit diagram showing an example of a tolerant input circuit in the prior art.

In the drawings, like numerals are used for like elements throughout.

Figure 3:
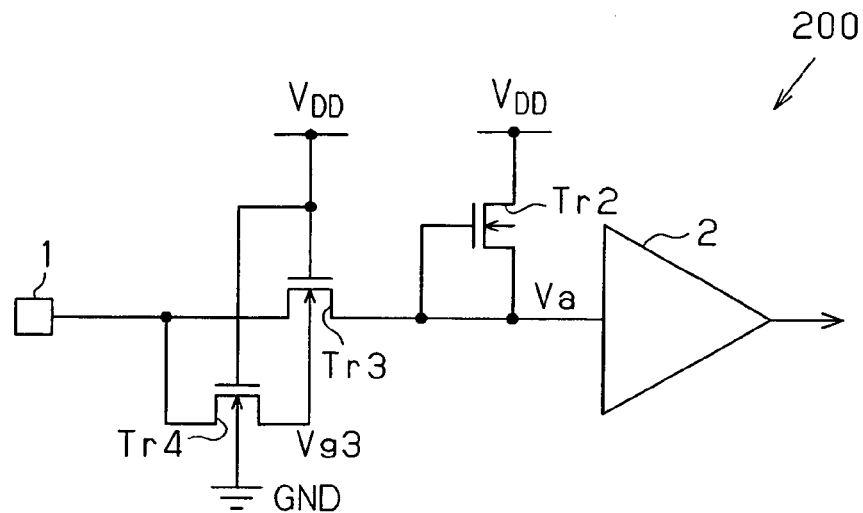
FIG. 3 is a schematic circuit diagram of a tolerant input circuit according to a first embodiment of the present invention.

FIG. 3 is a schematic circuit diagram of a tolerant input circuit 200 according to a first embodiment of the present invention. FIG. 3 shows a transistor Tr2 and an input buffer circuit 2, which are identical to the transistor Tr2 and the input buffer circuit 2 of the prior art example shown in FIG. 1.

An N-channel MOS transistor Tr3 is connected between an input pad 1 and an input terminal of the input buffer circuit 2. The gate of the transistor Tr3 is supplied with voltage from a power supply VDD, and the transistor Tr3 functions as a step-down device. An N-channel MOS transistor Tr4 is connected between the back gate of the transistor Tr3 and the input pad 1. The gate of the transistor Tr4 is supplied with voltage from the power supply VDD. The transistor Tr4 is kept constantly activated. When the input pad 1 is provided with a voltage signal having voltage that is higher than that of the power supply VDD, a voltage of VDD−Vth4 (Vth4 represents the threshold value of the transistor Tr4) is applied to the back gate of the transistor Tr3. Further, the back gate of the transistor Tr4 is supplied with ground potential, which is the substrate potential.

In the tolerant input circuit 200, when the input signal provided to the input pad 1 has a low level (e.g., 0 V), the transistor Tr3 is kept constantly activated, and the input voltage Va of the input buffer circuit 2 is set at a low level. In this state, the transistor Tr4 is also kept constantly activated, and back gate voltage Vg3 of the transistor Tr3 is set at a low level. Accordingly, when the signal provided to the input pad 1 has a low level, the tolerant input circuit 200 functions in the same manner as the tolerant input circuit 100 of the prior art shown in FIG. 1.

Figure 2:
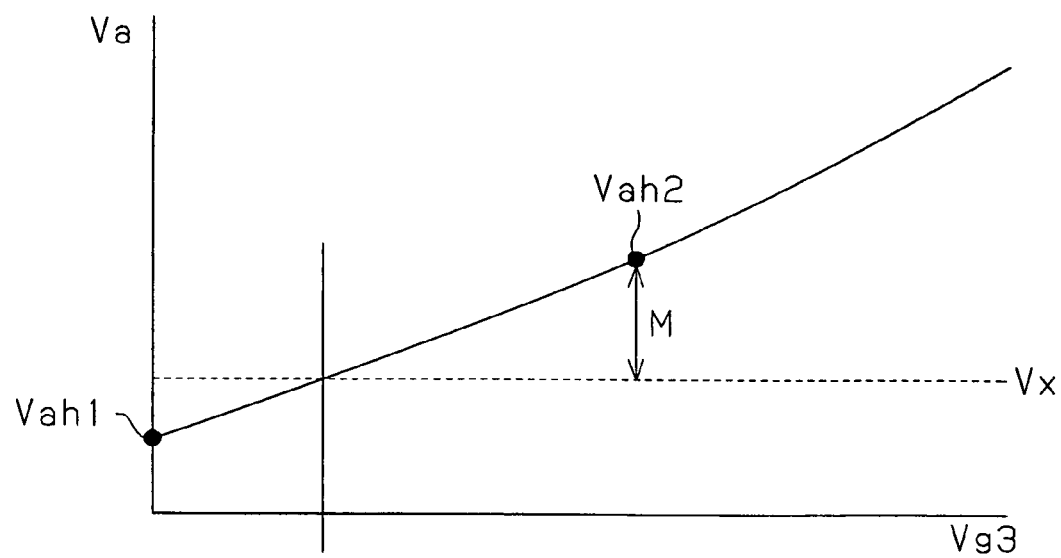
FIG. 2 is a graph showing the relationship between the back gate voltage of a step-down device and the input voltage of an input buffer circuit.

When the input signal provided to the input pad 1 rises to a high level in which the voltage is higher than that of the power supply VDD, the input voltage Va of the input buffer circuit 2 is set to VDD−Vth3. In this state, the back gate voltage Vg3 of the transistor Tr3 increases to power supply VDD−Vth4. This decreases the threshold value Vth3 of the transistor Tr3. As a result, the input voltage Va of the input buffer circuit 2 is increased in comparison with the prior art example. More specifically, referring to FIG. 2, when the input signal Vah2 of the input buffer circuit 2 rises to a high level, the threshold value Vth3 of the transistor Tr3 decreases and the voltage of the input signal Vah2 increases. This ensures a sufficient margin M for the threshold value Vx of the input buffer circuit 2.

The tolerant input circuit 200 of the first embodiment has the advantages described below.

(1) When a signal having voltage higher than that of the power supply VDD is provided to the input pad 1, the input voltage Va of the input buffer circuit 2 is decreased to VDD−Vth3. This ensures that the input voltage Va is less than the breakdown voltage of the input buffer circuit 2.

(2) When a signal having voltage higher than that of the power supply VDD is supplied to the input pad 1, the threshold value Vth3 of the transistor Tr3 functioning as a step-down device decreases. This ensures the margin M between the threshold value Vx of the input buffer circuit 2 and the input voltage Va. Accordingly, anomalous functioning of the input buffer circuit 2 is prevented.

(3) Only the transistor Tr4 is added to the prior art example. Thus, the circuit scale is not significantly enlarged.

(4) The threshold value Vth3 of the transistor Tr3 is decreased. Thus, even if fabrication differences result in differences in the threshold value Vth3 of the transistor Tr3, the influence of such difference is minimized.

Figure 4:
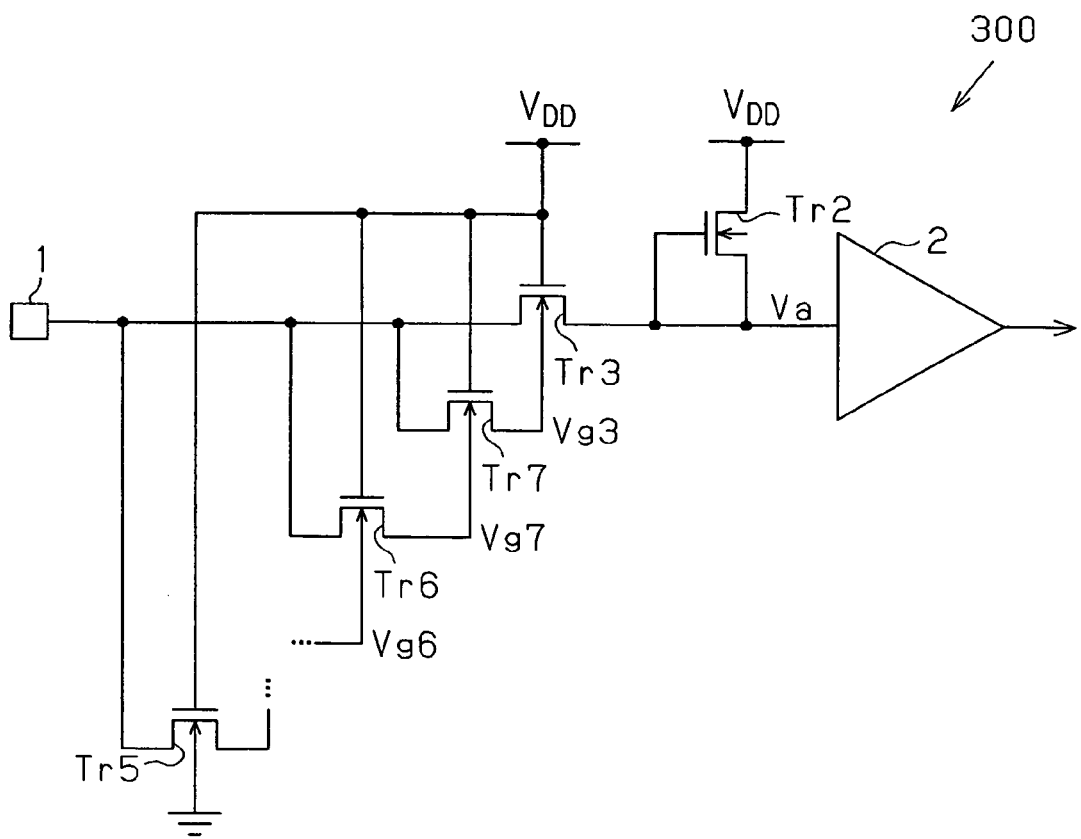
FIG. 4 is a schematic circuit diagram of a tolerant input circuit according to a second embodiment of the present invention.

FIG. 4 is a schematic circuit diagram of a tolerant input circuit 300 according to a second embodiment of the present invention. In the second embodiment, a plurality of N-channel MOS transistors are used to supply the transistor Tr3 with back gate voltage Vg3. More specifically, an N-channel MOS transistor Tr5 has a drain connected to the input pad 1 and a source connected to the back gate of a transistor in the following stage (not shown). An N-channel MOS transistor Tr6 has a drain connected to the input pad 1 and a source connected to the back gate of a transistor Tr7 in the following stage. Further, the N-channel MOS transistor Tr7 has a drain connected to the input pad 1 and a source connected to the back gate of the transistor Tr3. The gates of the transistors Tr5 to Tr7 are supplied with voltage from the power supply VDD.

The other parts of the tolerant input circuit 300 are configured in the same manner as the tolerant input circuit 200 of the first embodiment.

In the tolerant input circuit 300, the back gate voltages Vg6, Vg7, and Vg3 of the transistors Tr6, Tr7, and Tr3 are sequentially increased. This sequentially decreases the threshold values of the transistors Tr6, Tr7, and Tr3. As a result, the threshold value of the transistor Tr3 is further decreased from the first embodiment. Accordingly, when the input pad 1 is provided with a signal having a high level, the input voltage Va of the input buffer circuit 2 is decreased to the voltage of the power supply VDD or less, and the margin for the threshold value of the input buffer circuit 2 is further increased in comparison with the first embodiment.

Figure 5:
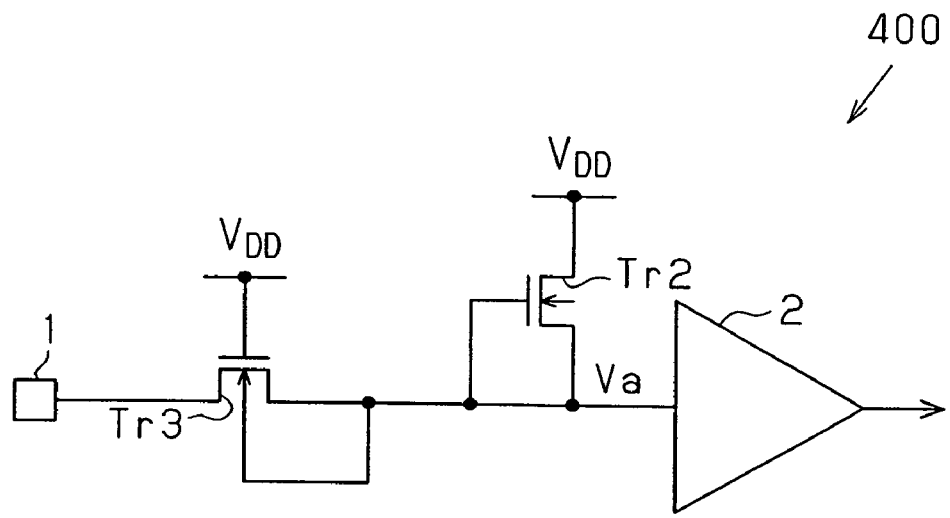
FIG. 5 is a schematic circuit diagram of a tolerant input circuit according to a third embodiment of the present invention.

FIG. 5 is a schematic circuit diagram of a tolerant input circuit 400 according to a third embodiment of the present invention. In the third embodiment, the back gate of the transistor Tr3 in the first embodiment is connected to the source of the transistor Tr3, or the input terminal of the input buffer circuit 2. The other parts of the tolerant input circuit 400 are configured in the same manner as the tolerant input circuit 200 of the first embodiment.

In the tolerant input circuit 400, when the signal provided to the input pad 1 has a high level, the input voltage Va of the input buffer circuit 2 is decreased to VDD−Vth3. However, the input voltage Va is supplied to the back gate of the transistor Tr3. This decreases the threshold value Vth3 of the transistor Tr3. Accordingly, the tolerant input circuit 400 of the third embodiment has the same advantages as the tolerant input circuit of the first embodiment. Further, there is no need for a new device that supplies the back gate voltage of the transistor Tr3. Therefore, the circuit scale is not enlarged.

Figure 6:
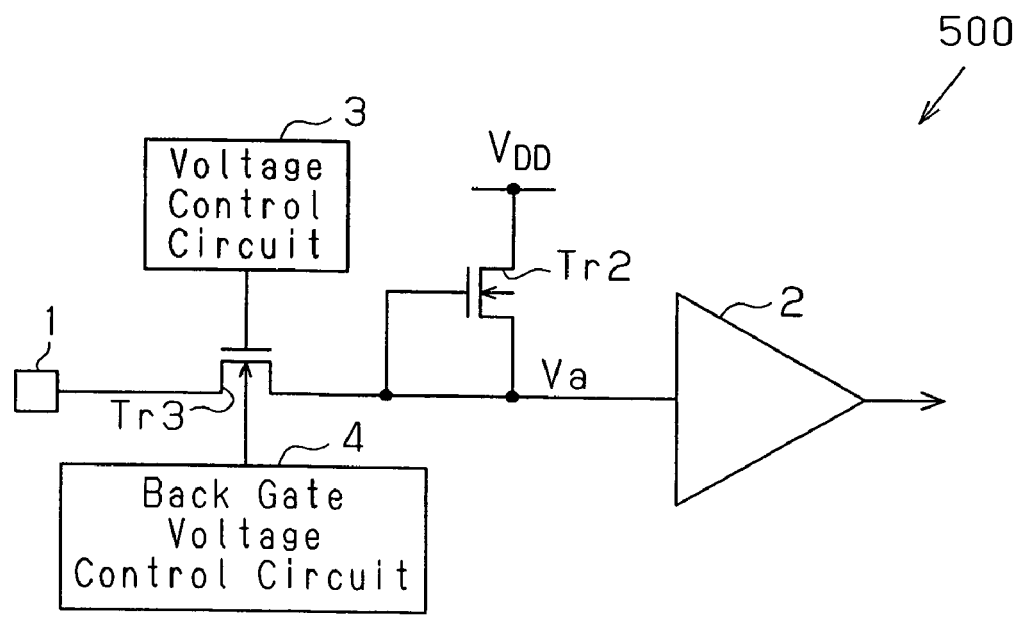
FIG. 6 is a schematic circuit diagram of a tolerant input circuit according to a fourth embodiment of the present invention.

FIG. 6 is a schematic circuit diagram of a tolerant input circuit 500 according to a fourth embodiment of the present invention. In the fourth embodiment, a voltage control circuit 3 controls the gate voltage of the transistor Tr3, which functions as a step-down device. A back gate voltage control circuit 4, which has the configuration of any one of the first, second, and third embodiments, controls the back gate voltage of the transistor Tr3.

Figure 7:
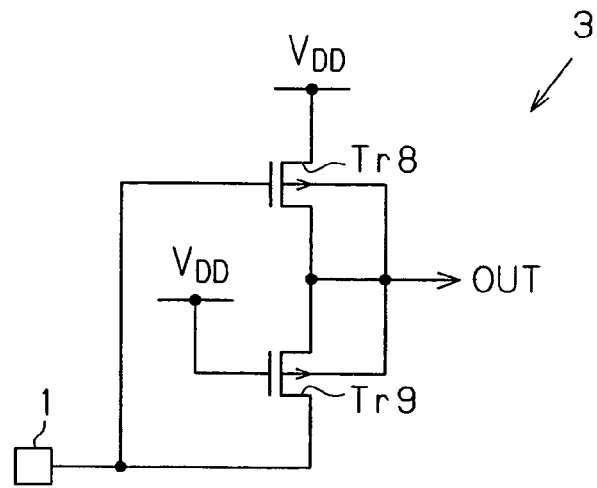
FIG. 7 is a schematic circuit diagram showing a voltage control circuit of the tolerant input circuit of FIG. 6.

The configuration of the voltage control circuit 3 will now be described in detail with reference to FIG. 7. A P-channel MOS transistor Tr8 has a source supplied with voltage from a power supply VDD and a gate connected to the input pad 1. The drain of the transistor Tr8 is connected to the drain of a P-channel MOS transistor Tr9. The transistor Tr9 has a gate supplied with voltage from the power supply VDD and a source connected to the input pad 1. The drains of the transistors Tr8 and Tr9 generate an output signal OUT, which is provided to the back gates of the transistors Tr8 and Tr9.

In the voltage control circuit 3, if the signal provided to the input pad 1 has a low level (ground level), the transistor Tr8 is activated and the transistor Tr9 is inactivated. This sets the output signal OUT to the level of the power supply VDD. When the signal provided to the input pad 1 rises to a high level that is greater than the power supply VDD by an amount corresponding to the threshold value voltage of the transistor Tr9, the transistor Tr8 is inactivated and the transistor Tr9 is activated. As a result, the output signal OUT is set to the voltage supplied to the input pad 1.

The gate of the transistor Tr3 is provided with the output signal OUT of the voltage control circuit 3. As a result, if the input voltage of the input pad 1 has a low level, the gate of the transistor Tr3 is supplied with the voltage of the power supply VDD. Thus, the tolerant input circuit 500 of the fourth embodiment functions in the same manner as the tolerant input circuit 200 of the first embodiment. If the input voltage of the input pad 1 is set to a high level, the gate of the transistor Tr3 is supplied with the input voltage of the input pad 1 that is higher than the voltage of the power supply VDD. Accordingly, the input voltage Va of the input buffer circuit 2 rises to a voltage obtained by decreasing an amount corresponding to the threshold value of the transistor Tr3 from the input voltage of the input pad 1. In this state, the threshold value of the transistor Tr3 is decreased due to the control of the back gate voltage. This further increases the input voltage Va of the input buffer circuit 2. Accordingly, in the fourth embodiment, the margin for the input voltage from the threshold value of the input buffer circuit 2 is further increased in comparison with each of the above embodiments.

Figure 8:
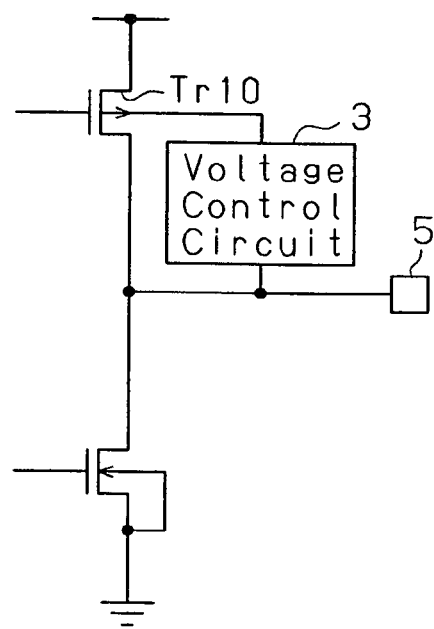
FIG. 8 is a schematic circuit diagram showing an output buffer circuit incorporating the voltage control circuit of the tolerant input circuit of FIG. 6.

The voltage control circuit 3 may be incorporated as a back gate voltage control circuit that controls the back gate voltage of a P-channel MOS transistor configuring an output buffer circuit. More specifically, referring to FIG. 8, the back gate of a P-channel MOS transistor Tr10 configuring an output buffer circuit is provided with the output signal OUT of the voltage control circuit 3. When the signal supplied to an input/output pad 5 has voltage that is higher than that of the power supply VDD, the output signal OUT of the voltage control circuit 3 is set to the voltage supplied to the input/output pad 5. This prevents leak current from flowing from the input/output pad 5 to the power supply VDD through the back gate of Tr10.

When the tolerant input circuit 500 is connected to the input/output pad 5, the output signal of the voltage control circuit 3 is provided to the gate of the transistor Tr3. This enables the voltage control circuit 3 used to control the back gate voltage of the output buffer circuit to also be used as the voltage control circuit of the tolerant input circuit 500.

It should be apparent to those skilled in the art that the present invention may be embodied in many other specific forms without departing from the spirit or scope of the invention. Particularly, it should be understood that the present invention may be embodied in the following forms.

An input buffer circuit 2 provided with a hysteresis characteristic may be used. In this case, each of the above embodiments enables the input buffer circuit 2 to function without having to vary the hysteresis characteristics.

The present examples and embodiments are to be considered as illustrative and not restrictive, and the invention is not to be limited to the details given herein, but may be modified within the scope and equivalence of the appended claims.

What is claimed is:

1. A tolerant input circuit for connection to a power supply and an input pad, the tolerant input circuit comprising:
   an input circuit;
   a step-down device including a first N-channel MOS transistor connected between the input pad and the input circuit, the first N-channel MOS transistor of the step-down device having a gate supplied with voltage from the power supply, wherein voltage of a high voltage signal provided to the input pad is decreased to a value lower than or equal to that of the voltage of the power supply by the step-down device and provided to the input circuit, the first N-channel MOS transistor including a back gate; and
   a back gate voltage control circuit, connected to the back gate of the first N-channel MOS transistor in the step-down device, for increasing back gate voltage of the first N-channel MOS transistor in the step-down device when the input pad is provided with the high voltage signal,
   wherein the back gate voltage control circuit includes:
   a second N-channel MOS transistor connected between the input pad and the back gate of the first N-channel MOS transistor in the step-down device, the second N-channel MOS transistor including a back gate; and a third N-channel MOS transistor connected between the input pad and the back gate of the second N-channel MOS transistor.

2. The tolerant input circuit according to claim 1, wherein the second N-channel MOS transistor includes a gate connected to the power supply.

3. The tolerant input circuit according to claim 1, further comprising:

an N-channel MOS transistor diode-connected between the power supply and a node, which is between the input circuit and the step-down device.

4. A tolerant input circuit for connection to a power supply and an input pad, the tolerant input circuit comprising:

an input circuit;

a step-down device including a first N-channel MOS transistor connected between the input pad and the input circuit, the first N-channel MOS transistor of the step-down device having a gate supplied with voltage from the power supply, wherein voltage of a high voltage signal provided to the input pad is decreased to a value lower than or equal to that of the voltage of the power supply by the step-down device and provided to the input circuit, and wherein the first N-channel MOS transistor includes a back gate and a source directly connected to the back gate to supply the back gate with voltage of the source so as to increase back gate voltage of the first N-channel MOS transistor in the step-down device when the input pad is provided with the high voltage signal; and a voltage control circuit, connected to the input pad and the gate of the first N-channel MOS transistor in the step-down device, for supplying the gate of the first N-channel MOS transistor in the step-down device with the high voltage signal when the input pad is provided with the high voltage signal having voltage greater than or equal to that of the power supply.

5. A tolerant input circuit for connection to a power supply and an input pad, the tolerant input circuit comprising:

an input circuit;

a step-down device including a first N-channel MOS transistor connected between the input pad and the input circuit, the first N-channel MOS transistor of the step-down device having a gate supplied with voltage from the power supply, wherein voltage of a high voltage signal provided to the input pad is decreased to a value lower than or equal to that of the voltage of the power supply by the step-down device and provided to the input circuit, the first N-channel MOS including a back gate;

a back gate voltage control circuit, connected to the back gate of the first N-channel MOS transistor in the step-down device, for increasing back gate voltage of the first N-channel MOS transistor in the step-down device when the input pad is provided with the high voltage signal; and a voltage control circuit, connected to the input pad and the gate of the first N-channel MOS transistor in the step-down device, for supplying the gate of the first N-channel MOS transistor in the step-down device with the high voltage signal when the input pad is provided with the high voltage signal having voltage greater than or equal to that of the power supply.

6. The tolerant input circuit according to claim 5, wherein the tolerant input circuit is connected to an output buffer circuit including a P-channel MOS transistor, and the voltage control circuit controls back gate voltage of the P-channel MOS transistor.

7. A tolerant input circuit for connection to a power supply and an input pad, the tolerant input circuit comprising:

an input circuit;

a first N-channel MOS transistor connected between the input pad and the input circuit, the first N-channel MOS transistor having a gate connected to the power supply, the first N-channel MOS transistor including a back gate;

a second N-channel MOS transistor connected between the input pad and the back gate of the first N-channel MOS transistor; and a third N-channel MOS transistor connected between the input pad and a back gate of the second N-channel MOS transistor.

8. The tolerant input circuit according to claim 7 wherein the second N-channel MOS transistor includes a gate connected to the power supply.

9. The tolerant input circuit according to claim 7, further comprising:

an N-channel MOS transistor diode-connected between the power supply and a node, which is between the input circuit and the first N-channel MOS transistor.

10. The tolerant input circuit according to claim 7 wherein the third N-channel MOS transistor includes a gate connected to the power supply and a back gate connected to ground.

11. A tolerant input circuit for connection to a power supply and an input pad, the tolerant input circuit comprising:

an input circuit;

a first N-channel MOS transistor connected between the input pad and the input circuit, the first N-channel MOS transistor having a gate connected to the power supply, the first N-channel MOS transistor including a back gate;

a second N-channel MOS transistor connected between the input pad and the back gate of the first N-channel MOS transistor; and a first P-channel MOS transistor connected between the gate of the first N-channel MOS transistor and the power supply, the first P-channel MOS transistor having a gate connected to the input pad and a back gate connected to the gate of the first N-channel MOS transistor; and a second P-channel MOS transistor connected between the gate of the first N-channel MOS transistor and the input pad, the second P-channel MOS transistor having a gate connected to the power supply and a back gate connected to the gate of the first N-channel MOS transistor.

12. A tolerant input circuit for connection to a power supply and an input pad, the tolerant input circuit comprising:

an input circuit;

a first N-channel MOS transistor connected between the input pad and the input circuit, the first N-channel MOS transistor having a gate connected to the power supply, a back gate connected to a node between the first N-channel MOS transistor and the input circuit and a source directly connected to the back gate to supply the back gate with voltage of the source; and a voltage control circuit, connected to the input pad and the gate of the first N-channel MOS transistor, for supplying the gate of the first N-channel MOS transistor with a high voltage signal when the input pad is provided with the high voltage signal having voltage greater than or equal to that of the power supply.

13. The tolerant input circuit according to claim 12 further comprising:
a second N-channel MOS transistor diode-connected between the power supply and the node.

* * * * *